(12) United States Patent
Cho et al.

(10) Patent No.: US 12,310,195 B2
(45) Date of Patent: *May 20, 2025

(54) DISPLAY APPARATUS

(71) Applicant: Samsung Display Co., Ltd., Yongin-si (KR)

(72) Inventors: Youngmin Cho, Yongin-si (KR); Hongam Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/216,602

(22) Filed: Jun. 30, 2023

(65) Prior Publication Data

US 2023/0345778 A1  Oct. 26, 2023

Related U.S. Application Data (63) Continuation of application No. 17/165,944, filed on Feb. 3, 2021, now Pat. No. 11,730,028.

(30) Foreign Application Priority Data

Jul. 31, 2020 (KR) .................. 10-2020-0096112

(51) Int. Cl.
*H10K 59/131* (2023.01)

(52) U.S. Cl.
CPC .................. *H10K 59/131* (2023.02)

(58) Field of Classification Search
CPC .... H10K 59/131; H10K 59/122; H10K 50/84; H10K 71/00; H10K 59/35; H10K 71/60
See application file for complete search history.

(56) References Cited

U.S. PATENT DOCUMENTS 8,772,796 B2  7/2014  Huang et al.
8,907,327 B2  12/2014  Kim et al.
(Continued)

FOREIGN PATENT DOCUMENTS

EP  3330790  6/2018
JP  2004-095756  3/2004
(Continued)

OTHER PUBLICATIONS

Non-Final Office Action issued Sep. 30, 2022, in U.S. Appl. No. 17/165,944.
(Continued)

*Primary Examiner* — Adam R. Giesy
(74) *Attorney, Agent, or Firm* — CANTOR COLBURN LLP (57) ABSTRACT

A display apparatus including a substrate including a display area and a peripheral area outside the display area, a first pad disposed on a first insulating layer in the peripheral area, a second pad disposed on a second insulating layer different from the first insulating layer, a third pad disposed on the second insulating layer, a first auxiliary pad overlapping the first pad, a second auxiliary pad overlapping the second pad, a third auxiliary pad overlapping the third pad, a first connection line disposed on the first insulating layer and connected to the first pad, a second connection line disposed on the second insulating layer and connected to the second pad, and a third connection line disposed on the second insulating layer, connected to the third pad, and disposed between the first connection line and the second connection line.

19 Claims, 8 Drawing Sheets

(56) References Cited

U.S. PATENT DOCUMENTS

| | | |
|---|---|---|
| 9,366,927 B2 | 6/2016 | Jung |
| 9,936,591 B2 | 4/2018 | Kim et al. |
| 9,954,009 B2 | 4/2018 | Lee |
| 9,980,398 B2 | 5/2018 | Kim et al. |
| 10,032,804 B2 | 7/2018 | Takahashi et al. |
| 10,054,811 B2 | 8/2018 | Park et al. |
| 10,091,876 B2 | 10/2018 | Kim et al. |
| 10,095,075 B2 | 10/2018 | Moh et al. |
| 10,201,083 B2 | 2/2019 | Kim et al. |
| 10,405,437 B2 | 9/2019 | Ha et al. |
| 10,551,682 B2 | 2/2020 | Ogasawara et al. |
| 10,580,850 B2 | 3/2020 | Lee et al. |
| 10,620,730 B2 | 4/2020 | Yoshida et al. |
| 10,739,892 B2 | 8/2020 | Shim et al. |
| 10,782,573 B2 | 9/2020 | Park et al. |
| 10,910,409 B2 | 2/2021 | Lee et al. |
| 2004/0159930 A1 | 8/2004 | Makita et al. |
| 2007/0188693 A1 | 8/2007 | Hwang et al. |
| 2014/0042394 A1 | 2/2014 | Lee |
| 2015/0144940 A1 | 5/2015 | Hong et al. |
| 2016/0103548 A1 | 4/2016 | Jun |
| 2018/0076234 A1* | 3/2018 | Kim .................. G02F 1/13458 |
| 2018/0158837 A1 | 6/2018 | Lee et al. |
| 2019/0058028 A1 | 2/2019 | Won |
| 2019/0074395 A1 | 3/2019 | Jang et al. |
| 2019/0096979 A1 | 3/2019 | Jo et al. |
| 2019/0123117 A1 | 4/2019 | Kwon et al. |
| 2019/0348485 A1 | 11/2019 | Jo et al. |
| 2019/0348489 A1 | 11/2019 | Na et al. |
| 2020/0058725 A1 | 2/2020 | Ka et al. |
| 2020/0091268 A1 | 3/2020 | Cho et al. |
| 2020/0203390 A1 | 6/2020 | Kim et al. |

FOREIGN PATENT DOCUMENTS

| | | |
|---|---|---|
| JP | 2011-008051 | 1/2011 |
| JP | 2015-106109 | 6/2015 |
| JP | 6462135 | 1/2019 |
| JP | 6469233 | 2/2019 |
| KR | 10-2004-0075377 | 8/2004 |
| KR | 10-2005-0044947 | 5/2005 |
| KR | 10-2007-0003178 | 1/2007 |
| KR | 10-2014-0106851 | 9/2014 |
| KR | 1020150002344 A | 1/2015 |
| KR | 1020150059239 A | 6/2015 |
| KR | 10-2015-0080825 | 7/2015 |
| KR | 10-2017-0007649 | 1/2017 |
| KR | 10-1699405 | 2/2017 |
| KR | 10-2017-0036942 | 4/2017 |
| KR | 10-2017-0069350 | 6/2017 |
| KR | 10-2017-0070919 | 6/2017 |
| KR | 10-2017-0127109 | 11/2017 |
| KR | 10-2017-0143142 | 12/2017 |
| KR | 10-2018-0025411 | 3/2018 |
| KR | 10-2018-0025421 | 3/2018 |
| KR | 10-2018-0029169 | 3/2018 |
| KR | 10-2018-0062508 | 6/2018 |
| KR | 10-2018-0063931 | 6/2018 |
| KR | 10-2019-0018986 | 2/2019 |
| KR | 1020190036008 A | 4/2019 |
| KR | 10-2019-0064710 | 6/2019 |
| KR | 10-2019-0110980 | 10/2019 |
| KR | 10-2019-0125258 | 11/2019 |
| KR | 10-2019-0130699 | 11/2019 |
| KR | 10-2019-0130707 | 11/2019 |
| KR | 10-2020-0021569 | 3/2020 |
| KR | 10-2020-0032302 | 3/2020 |

OTHER PUBLICATIONS

Notice of Allowance issued Mar. 30, 2023, in U.S. Appl. No. 17/165,944.

* cited by examiner

DISPLAY APPARATUS

CROSS-REFERENCE TO RELATED APPLICATIONS

This application is a Continuation of U.S. patent application Ser. No. 17/165,944, filed Feb. 3, 2021, which claims priority from and the benefit of Korean Patent Application No. 10-2020-0096112, filed on Jul. 31, 2020, each of which is hereby incorporated by reference for all purposes as if fully set forth herein.

BACKGROUND

Field

Embodiments of the invention relate generally to a display apparatus, and, more particularly, to a display apparatus capable of displaying a high-resolution image and having a reduced peripheral area.

Discussion of the Background

In general, a display apparatus includes a display area in which an image is displayed, and a peripheral area. Electronic devices such as integrated circuits may be located in the peripheral area to generate or transmit electrical signals to the display area.

As the resolution of images displayed in the display area increases, the number of lines for transmitting electrical signals to the display area increases, and the number of pads that correspond to these lines and to which bumps of electronic devices are connected also increases.

However, as the number of pads and the number of lines connected thereto increase, the area of the peripheral area outside the display area is generally increased.

The above information disclosed in this Background section is only for understanding of the background of the inventive concepts, and, therefore, it may contain information that does not constitute prior art.

SUMMARY

Display apparatus constructed according to embodiments of the invention are capable of displaying a high-resolution image while having a reduced peripheral area.

Additional features of the inventive concepts will be set forth in the description which follows, and in part will be apparent from the description, or may be learned by practice of the inventive concepts.

A display apparatus according to an embodiment includes a substrate including a display area and a peripheral area outside the display area, a first pad disposed on a first layer in the peripheral area, a second pad disposed adjacently to the first pad in a first direction in the peripheral area, the second pad being disposed on a second layer different from the first layer, a third pad disposed adjacently to the first pad in a second direction in the peripheral area, the third pad being disposed on the second layer, a first connection line disposed on the first layer and connected to the first pad, a second connection line disposed on the second layer and connected to the second pad, and a third connection line disposed on the second layer, connected to the third pad, and disposed between the first connection line and the second connection line.

The second layer may cover the first pad.

The first connection line and the first pad may include the same layer structure, the second connection line and the second pad may include the same layer structure, and the third connection line and the third pad may include the same layer structure.

The first, second, and third connection lines may extend in a direction towards the display area.

The first connection line may be electrically connected to a first data line over the display area, the second connection line may be electrically connected to a second data line over the display area, and the third connection line may be electrically connected to a third data line over the display area.

The third data line may be disposed between the first data line and the second data line.

The display apparatus may further include a first test line disposed on the first layer and connected to the first pad, a second test line disposed on the second layer and connected to the second pad, and a third test line disposed on the second layer, connected to the third pad, and disposed between the first test line and the second test line.

The second layer may cover the first test line.

The first test line and the first pad may include the same layer structure, the second test line and the second pad may include the same layer structure, and the third test line and the third pad may include the same layer structure.

The first, second, and third test lines may extend in a direction away from the display area.

Each of the first, second, and third test lines may be electrically connected to a corresponding test transistor, respectively.

The display apparatus may further include bridge lines electrically connecting the first, second, and third test lines to corresponding test transistors, respectively.

The bridge lines may be disposed on a third layer covering the second test line and the third test line.

A distance between an edge of the first pad in a direction to the second pad and an edge of the second pad in a direction to the first pad may be about 10.5 µm to about 22 µm.

A width of the first pad in a direction to the second pad may be about 6 µm to about 25.5 µm.

A width of each of the first to third connection lines may be about 2 µm to about 3 µm.

The display apparatus may further include a third layer covering the second pad and the third pad, a first auxiliary pad disposed on the third layer, overlapping the first pad in a plan view, and electrically connected to the first pad, a second auxiliary pad disposed on the third layer, overlapping the second pad in a plan view, and electrically connected to the second pad, and a third auxiliary pad disposed on the third layer, overlapping the third pad in a plan view, and electrically connected to the third pad.

The first auxiliary pad may overlap the third connection line in a plan view.

A display apparatus according to another embodiment includes a substrate including a display area and a peripheral area outside the display area, a plurality of pads disposed on a first layer in the peripheral area and arranged substantially in parallel with each other in a first direction, a plurality of auxiliary pads disposed on a second layer different from the first layer in the peripheral area, arranged substantially in parallel with each other in the first direction, and interposed between the plurality of pads, connection lines disposed on the first layer and connected to the pads, and auxiliary connection lines disposed on the second layer and connected to the auxiliary pads.

The pads and the auxiliary pads may be alternately arranged in the first direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
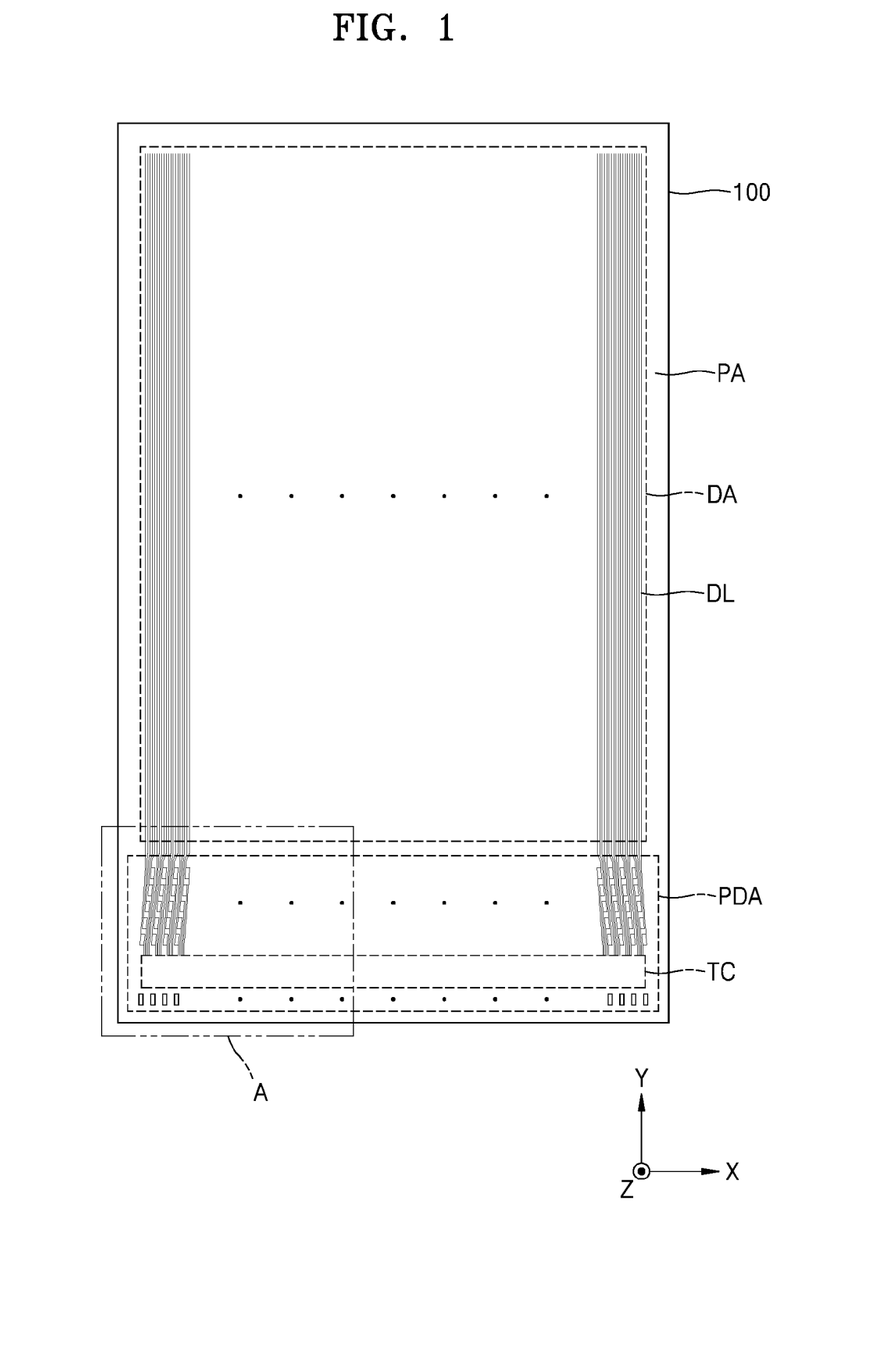
FIG. 1 is a schematic plan view of a portion of a display apparatus according to an embodiment of the invention.
Figure 2:
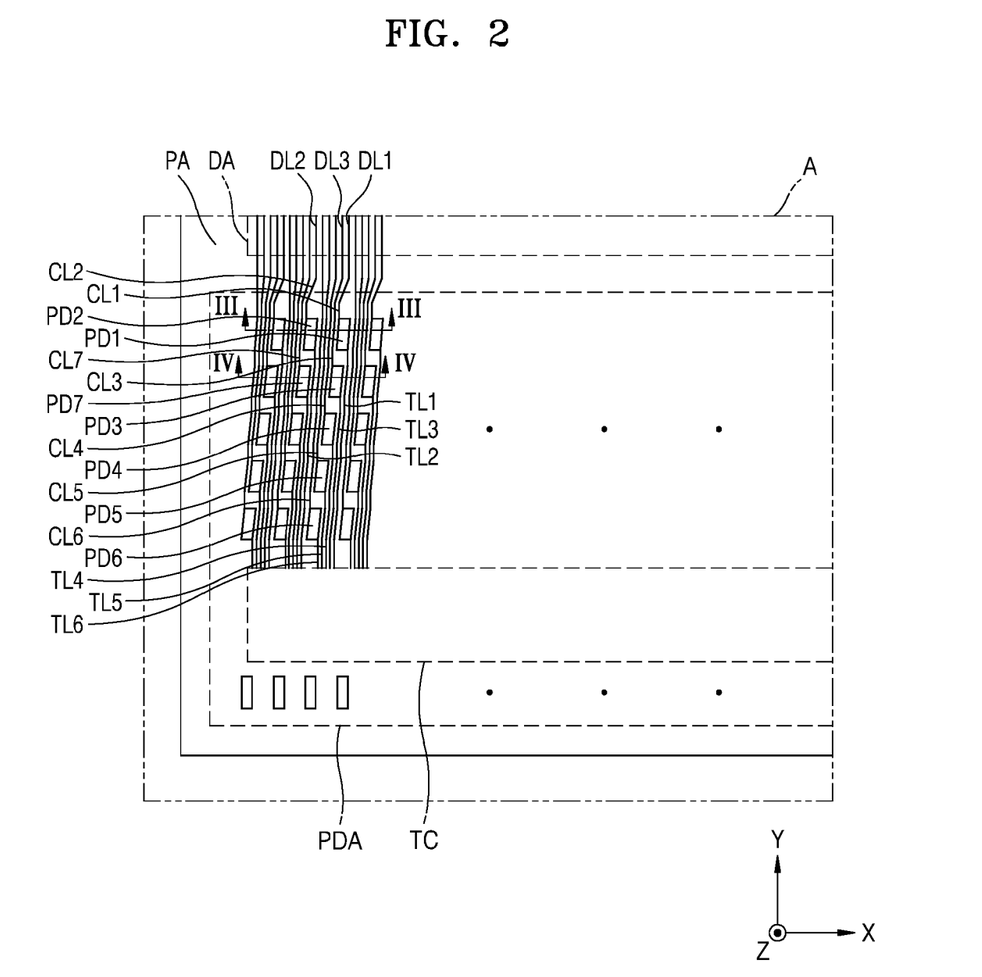
FIG. 2 is an enlarged plan view of portion A of FIG. 1 according to an embodiment of the invention.
Figure 3:
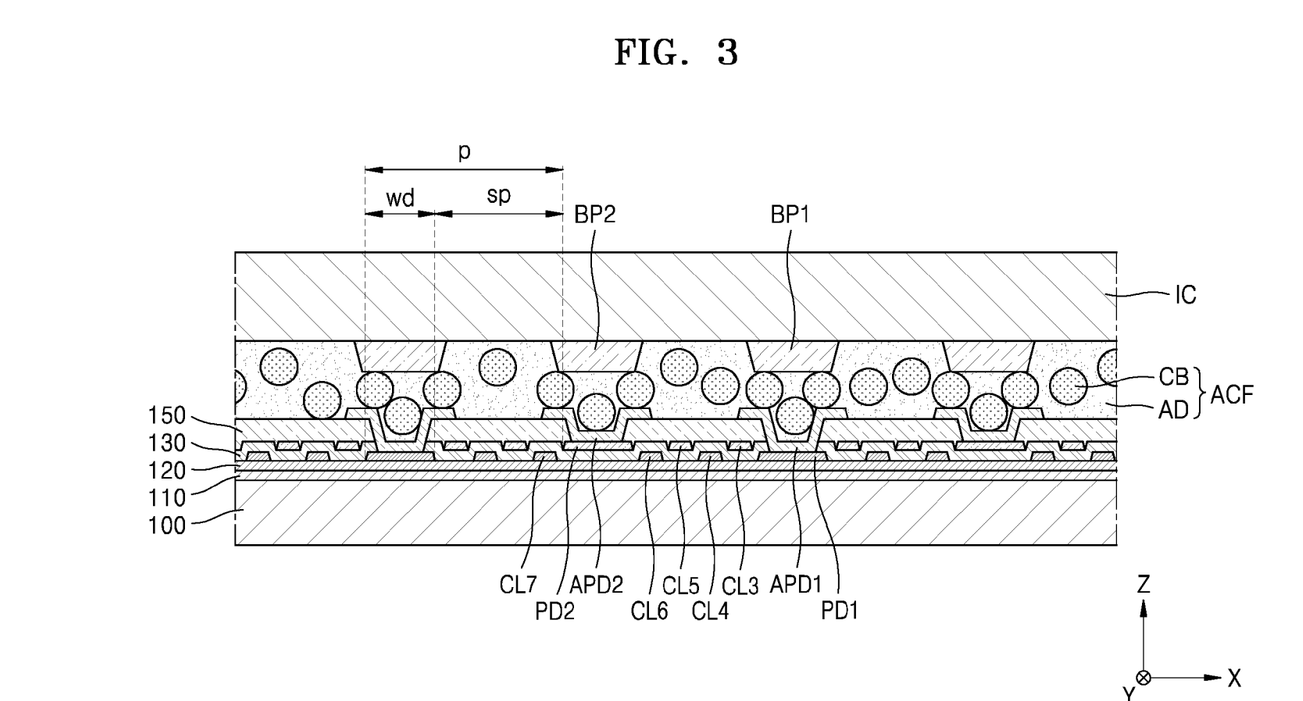
FIG. 3 is a schematic cross-sectional view taken along line III-III of the display apparatus of FIG. 2 according to an embodiment of the invention.
Figure 4:
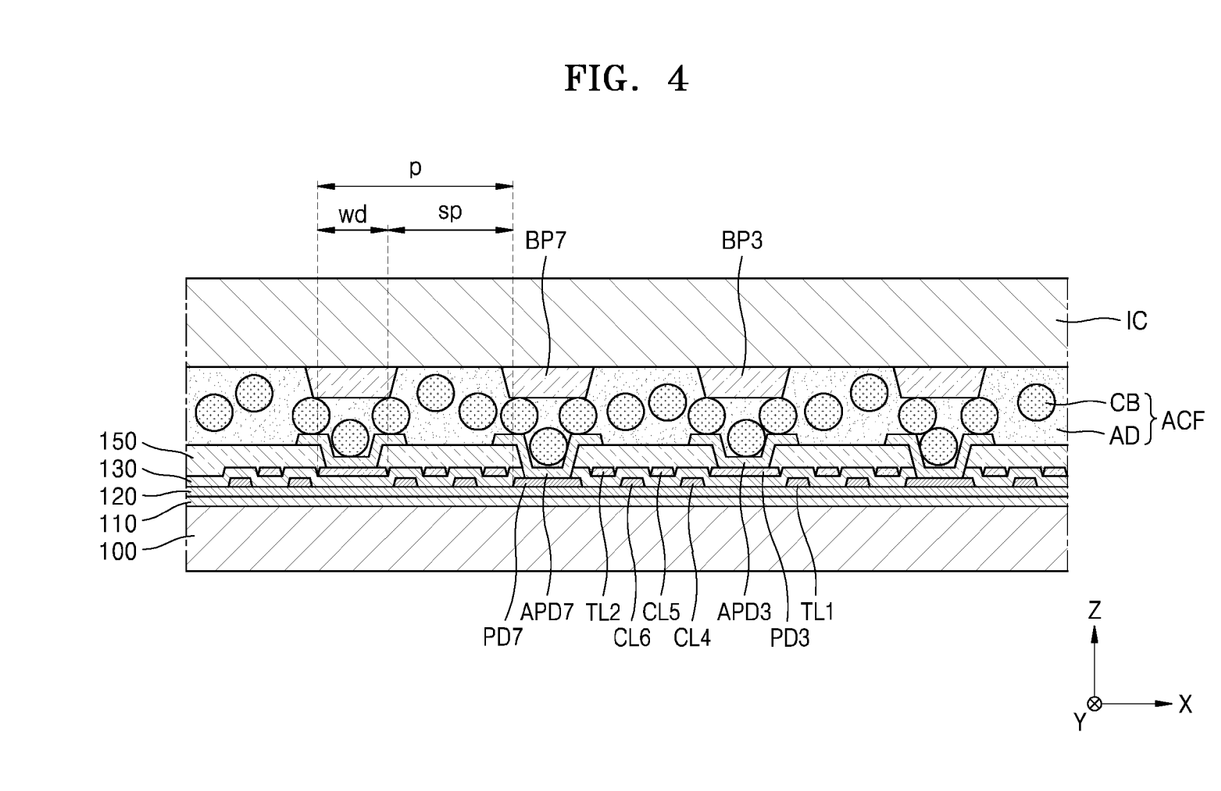
FIG. 4 is a schematic cross-sectional view taken along line IV-IV of the display apparatus of FIG. 2 according to an embodiment of the invention.
Figure 5:
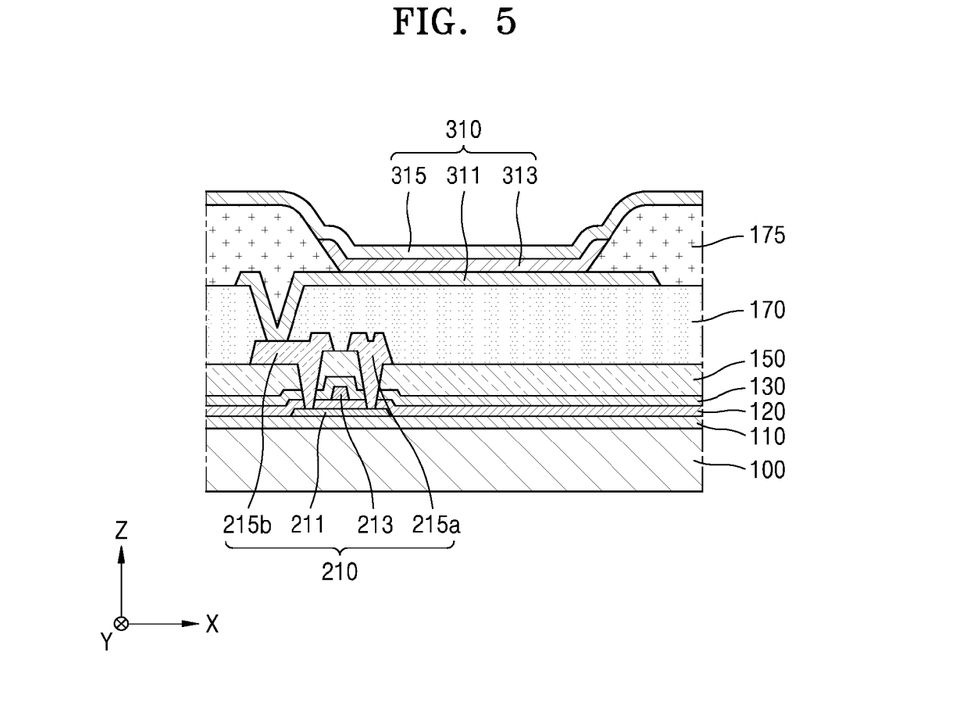
FIG. 5 is a schematic cross-sectional view of a portion of a display area of FIG. 1 according to an embodiment of the invention.

FIG. 1 is a schematic plan view of a portion of a display apparatus according to an embodiment, FIG. 2 is an enlarged plan view of portion A of FIG. 1 according to an embodiment, FIG. 3 is a schematic cross-sectional view taken along line III-III of the display apparatus of FIG. 2 according to an embodiment, and FIG. 4 is a schematic cross-sectional view taken along line IV-IV of the display apparatus of FIG. 2 according to an embodiment. FIG. 5 is a schematic cross-sectional view of a portion of a display area of FIG. 1 according to an embodiment.

Referring to FIG. 1, the display apparatus according to the illustrated embodiment has a display area DA in which a plurality of pixels are located, and a peripheral area PA located outside the display area DA. A substrate 100 included in the display apparatus has the display area DA and the peripheral area PA. The peripheral area PA includes a pad area PDA to which various electronic devices, printed circuit boards, and the like are electrically bonded. The pad area PDA includes a test circuit part TC that may be used to test whether images are correctly displayed in the display area DA.

FIG. 1 exemplarily shows a substrate or the like during a manufacturing process. In a final display apparatus or an electronic apparatus such as a smartphone including the display apparatus, a portion of the substrate 100 or the like may be bent so as to minimize the area of the peripheral area PA that may be recognized by a user. For example, when the peripheral area PA includes a bending area, the bending area may be located between the pad area PDA and the display area DA. In this case, the substrate 100 may be bent in the bending area so that at least a part of the pad area PDA is located to overlap the display area DA. In this case, a bending direction is set so that the pad area PDA does not cover the display area DA, but the pad area PDA is located behind the display area DA. In this manner, a user may recognize that the display area DA occupies most of the display apparatus.

The substrate 100 may be flexible or bendable. For example, the substrate 100 may include a polymer resin, such as polyethersulphone, polyacrylate, polyetherimide, polyethylene naphthalate, polyethylene terephthalate, polyphenylene sulfide, polyarylate, polyimide, polycarbonate, or cellulose acetate propionate. However, the inventive concepts are not limited thereto. For example, in some embodiments, the substrate 100 may have a multiple layer structure that includes two layers each including the above-described polymer resin, and a barrier layer arranged between the two layers and including an inorganic material (e.g., silicon oxide, silicon nitride, silicon oxynitride, etc.). Furthermore, when the substrate 100 is not bent, the substrate 100 may include glass or the like.

A thin-film transistor 210 is disposed on the substrate 100, as shown in FIG. 5. The thin-film transistor 210 may include a semiconductor layer 211, a gate electrode 213, a source electrode 215a, and a drain electrode 215b. The semiconductor layer 211 may include amorphous silicon, polycrystalline silicon, an oxide semiconductor material, or an organic semiconductor material.

The thin-film transistor 210 includes the gate electrode 213. The gate electrode 213 may include metal such as molybdenum or aluminum, and may have a single layer or a multiple layer structure. When the gate electrode 213 has a multiple layer structure, the gate electrode 213 may have a three-layer structure of molybdenum/aluminum/molybdenum. In order to secure an electrical insulation between the gate electrode 213 and the semiconductor layer 211, a first gate insulating layer 120 may be between the gate electrode 213 and the semiconductor layer 211. The first gate insulating layer 120 may include an inorganic material, such as silicon oxide, silicon nitride, and/or silicon oxynitride.

The gate electrode 213 may be covered by the second gate insulating layer 130, as shown in FIG. 5. In some embodiments, the gate electrode 213 may be disposed on the second gate insulating layer 130, rather than being disposed between the first gate insulating layer 120 and the second gate insulating layer 130. Hereinafter, the gate electrode 213 will exemplarily be described as being disposed between the first gate insulating layer 120 and the second gate insulating layer 130. The second gate insulating layer 130 may also include an inorganic material such as silicon oxide, silicon nitride, and/or silicon oxynitride.

An interlayer insulating layer 150 may be arranged above the gate electrode 213 and the second gate insulating layer 130. The interlayer insulating layer 150 may include an inorganic material, such as silicon oxide, silicon nitride, and/or silicon oxynitride. The source electrode 215a and the drain electrode 215b of the thin-film transistor 210 may be arranged on the interlayer insulating layer 150. The source electrode 215a and the drain electrode 215b may include metal, such as titanium, copper, or aluminum, and may have a single layer structure or a multiple layer structure. When the source electrode 215a and the drain electrode 215b have a multiple layer structure, the source electrode 215a and the drain electrode 215b may have a three-layer structure of titanium/aluminum/titanium.

Insulating layers including an inorganic material, such as the first gate insulating layer 120, the second gate insulating layer 130, and the interlayer insulating layer 150, may be formed through chemical vapor deposition (CVD) or atomic layer deposition (ALD).

A buffer layer 110 may be between the thin-film transistor 210 and the substrate 100. The buffer layer 110 may include an inorganic material, such as silicon oxide, silicon nitride, and/or silicon oxynitride. The buffer layer 110 may increase flatness of the upper surface of the substrate 100, and/or may prevent or reduce the permeation of impurities from the substrate 100 or the like to the semiconductor layer 211 of the thin-film transistor 210.

The display apparatus according to the illustrated embodiment includes a plurality of pads in the pad area PDA, as shown in FIG. 2. In particular, the display apparatus according to the illustrated embodiment includes a first pad PD1, a second pad PD2, and a third pad PD3 in the pad area PDA. At least one of the first to third pads PD1, PD2, and PD3 may be disposed on a different layer. For example, the first pad PD1 may be disposed on the first gate insulating layer 120, which may be referred to as a first layer, as shown in FIG. 3, and the second pad PD2 and the third pad PD3 may be disposed on the second gate insulating layer 130, which may be referred to as a second layer, as shown in FIGS. 3 and 4. In this case, the second pad PD2 is located adjacent to the first pad PD1. More particularly, the second pad PD2 is located in a first direction (-x direction) from the first pad PD1. The third pad PD3 is also located adjacent to the first pad PD1. More particularly, the third pad PD3 is located in a second direction (-y direction) from the first pad PD1.

The display apparatus according to the illustrated embodiment may include a plurality of pads in addition to the first to third pads PD1 to PD3. FIG. 2 illustrates that a fourth pad PD4 is located in the second direction (approximately -y direction) from the third pad PD3, a fifth pad PD5 is located in the second direction (approximately -y direction) from the fourth pad PD4, and a sixth pad PD6 is located in the second direction (approximately -y direction) from the fifth pad PD5. The fourth pad PD4 and the sixth pad PD6 are disposed on the first gate insulating layer 120 or the first layer as the first pad PD1. The fifth pad PD5 is disposed on the second gate insulating layer 130 or the second layer as the third pad PD3.

As shown FIGS. 2 and 3, a plurality of pads including the first pad PD1 are arranged substantially in parallel in the first direction (-x direction). Similarly, a plurality of additional pads including the second pad PD2 are arranged substantially in parallel in the first direction (-x direction). As such, the additional pads may be disposed between the pads. In this case, the pads including the first pad PD1 are disposed on the first gate insulating layer 120 or the first layer, and the additional pads including the second pad PD2 are disposed on the second gate insulating layer 130 or the second layer. In this manner, the pads and the additional pads are alternately arranged in the first direction (-x direction).

A first connection line CL1 is connected to the first pad PD1, a second connection line CL2 is connected to the second pad PD2, and a third connection line CL3 is connected to the third pad PD3. As the first pad PD1 is disposed on the first gate insulating layer 120 or the first layer, the first connection line CL1 is also disposed on the first gate insulating layer 120 or the first layer. As the second pad PD2 is disposed on the second gate insulating layer 130 or the second layer, the second connection line CL2 is also disposed on the second gate insulating layer 130 or the second layer. As the third pad PD3 is disposed on the second gate insulating layer 130 or the second layer, the third connection line CL3 is also disposed on the second gate insulating layer 130 or the second layer, as shown in FIG. 3. In this case, the third connection line CL3 passes between the first connection line CL1 and the second connection line CL2, as shown in FIG. 2.

A fourth connection line CL4 is connected to the fourth pad PD4, a fifth connection line CL5 is connected to the fifth pad PD5, and a sixth connection line CL6 is connected to the sixth pad PD6. As the fourth pad PD4 and the sixth pad PD6 are disposed on the first gate insulating layer 120 or the first layer, the fourth connection line CL4 and the sixth connection line CL6 are also disposed on the first gate insulating layer 120 or the first layer. Because the fifth pad PD5 is disposed on the second gate insulating layer 130 or the second layer, the fifth connection line CL5 is also disposed on the second gate insulating layer 130 or the second layer.

As described above, when the pads including the first pad PD1 are arranged substantially in parallel in the first direction (-x direction) and the additional pads including the second pad PD2 are arranged substantially in parallel in the first direction (-x direction), the connection lines connected to the pads, including the first connection line CL1, are disposed on the first gate insulating layer 120 or the first layer, and additional connection lines connected to the additional pads, including the second connection line CL2, are disposed on the second gate insulating layer 130 or the second layer.

As the resolution of image displayed in the display area DA increases, the number of connection lines for transmitting electrical signals to the display area DA is generally increased. Also, the number of pads that correspond to the connection lines and to which bumps of an electronic device are connected is also generally increased. However, in the display apparatus according to the illustrated embodiment, even when the number of connection lines and the number of pads are increased, the area of the peripheral area PA may be minimized. More particularly, a distance between the adjacent connection lines may be significantly narrowed by arranging the adjacent connection lines on different layers from each other. As such, even when the number of connection lines are increased, the connection lines may be located within a narrow area while being the connection lines are prevented from being short-circuited to each other.

In particular, as illustrated in FIG. 3, the third connection line CL3, the fourth connection line CL4, the fifth connection line CL5, and the sixth connection line CL6 are sequentially located in the first direction (-x direction). The third connection line CL3 and the fifth connection line CL5 are disposed on the second gate insulating layer 130 or the second layer, and the fourth connection line CL4 and the sixth connection line CL6 are disposed on the first gate insulating layer 120 or the first layer. In this manner, since adjacent connection lines are disposed on different layers from each other, the adjacent connection lines may not be electrically short-circuited even when the distance between the adjacent connection lines decreases. As such, the total area of the peripheral area PA may be reduced.

The inventive concepts are not limited to the relationship between the connection lines. For example, as illustrated in FIG. 3, the first pad PD1 is located on a layer different from the third connection line CL3 adjacent thereto. In particular, the first pad PD1 is disposed on the first gate insulating layer 120 or the first layer. The third connection line CL3 that is most adjacent to the first pad PD1 is disposed on the second gate insulating layer 130 or the second layer, and is located in the first direction (−x direction) from the first pad PD1. In this manner, even when the distance between the first pad PD1 and the third connection line CL3 decreases, the probability of occurrence of a short-circuit therebetween is very low, and thus, the area of the peripheral area PA may be significantly reduced.

To this end, the second gate insulating layer 130 or the second layer may cover the first pad PD1, the fourth connection line CL4, and the sixth connection line CL6, which are disposed on the first gate insulating layer 120 or the first layer. As such, the third connection line CL3, the fifth connection line CL5, and the second pad PD2, which are disposed on the second gate insulating layer 130 or the second layer, and the first pad PD1, the fourth connection line CL4, and the sixth connection line CL6, which are located below the second gate insulating layer 130, may be reliably electrically insulated.

As illustrated in FIG. 2, the first pad PD1, the third pad PD3, the fourth pad PD4, the fifth pad PD5, and the sixth pad PD6 are sequentially arranged in the second direction (approximately −y direction), and the adjacent pads are disposed on different layers from each other. In particular, the first pad PD1, the fourth pad PD4, and the sixth pad PD6 are disposed on the first gate insulating layer 120 or the first layer, and the third pad PD3 and the fifth pad PD5 are disposed on the second gate insulating layer 130 or the second layer. This location relationship may also be applied to the second pad PD2 and pads located in the second direction (approximately −y direction) from the second pad PD2. For example, the seventh pad PD7 that is adjacently located to the second pad PD2 in the second direction (approximately −y direction) may be disposed on a layer different from a layer on which the second pad PD2 is located. More particular, unlike the second pad PD2 disposed on the second gate insulating layer 130 or the second layer, the seventh pad PD7 may be disposed on the first gate insulating layer 120 or the first layer. In this manner, as illustrated in FIG. 3, the seventh connection line CL7 connected to the seventh pad PD7 is disposed on the first gate insulating layer 120 and is disposed on a layer different from a layer on which the adjacent second pad PD2 is located.

As illustrated in FIGS. 3 and 4, even the pads are sequentially arranged in the first direction (−x direction), the adjacent pads are disposed on different layers from each other. More particularly, the first pad PD1 is disposed on the first gate insulating layer 120 that is the first layer, and the second pad PD2 is disposed on the second gate insulating layer 130 that is the second layer. Similarly, the seventh pad PD7 is disposed on the first gate insulating layer 120 that is the first layer, and the third pad PD3 is disposed on the second gate insulating layer 130 that is the second layer.

Each connection line may have substantially the same layer structure as that of the connected pad. This is because each connection line may be simultaneously formed using the same material as that of the connected pad. For example, the first connection line CL1 may have substantially the same layer structure as that of the first pad PD1, the second connection line CL2 may have substantially the same layer structure as that of the second pad PD2, and the third connection line CL3 may have substantially the same layer structure as that of the third pad PD3. For example, the first to third connection lines CL1 to CL3 may each include metal such as molybdenum or aluminum, and may have a single layer or a multiple layer structure. When the first to third connection lines CL1 to CL3 have a multiple layer structure, the gate electrode 213 may have a three-layer structure of molybdenum/aluminum/molybdenum.

As illustrated in FIG. 2, the first to third connection lines CL1 to CL3 may extend in a direction towards the display area DA (approximately +y direction). The first to third connection lines CL1 to CL3 may be electrically connected to the corresponding data lines DL. For example, the first connection line CL1 may be electrically connected to a first data line DL1 of the display area DA, the second connection line CL2 may be electrically connected to a second data line DL2 of the display area DA, and the third connection line CL3 may be electrically connected to a third data line DL3 of the display area DA. In this case, the third data line DL3 may be located between the first data line DL1 and the second data line DL2.

As described above, the first connection line CL1 is disposed on the first gate insulating layer 120 that is the first layer, and the second connection line CL2 and the third connection line CL3 are disposed on the second gate insulating layer 130 that is the second layer. As such, when the first to third data lines DL1 to DL3 are disposed on a layer other than the first gate insulating layer 120 or the second gate insulating layer 130, the first to third data lines DL1 to DL3 may be connected to the first to third connection lines CL1 to CL3 via contact holes.

For example, as illustrated in FIG. 3, when the interlayer insulating layer 150, which may be referred to as a third layer, covers the second connection line CL2 and the third connection line CL3, the first to third data lines DL1 to DL3 may be disposed on the interlayer insulating layer 150. The first to third data lines DL1 to DL3 are electrically connected to the first to third connection lines CL1 to CL3 via contact holes formed in the interlayer insulating layer 150. The first to third data lines DL1 to DL3 may be simultaneously formed using the same material as that of the source electrode 215a (see FIG. 5) and the drain electrode 215b (see FIG. 5). As such, the first to third data lines DL1 to DL3 may have substantially the same layer structures as those of the source electrode 215a and the drain electrode 215b. For example, the first to third data lines DL1 to DL3 may each include metal, such as titanium, copper, or aluminum, and may have a single layer structure or a multiple layer structure. When the first to third data lines DL1 to DL3 have a multiple layer structure, the first to third data lines DL1 to DL3 may have a three-layer structure of titanium/aluminum/titanium.

As illustrated in FIGS. 3 and 4, auxiliary pads may be disposed on the pads, respectively. These auxiliary pads may be referred to as a fourth layer and are disposed on the interlayer insulating layer 150 covering the second pad PD2, the third pad PD3, and the seventh pad PD7. Contact holes may be formed in the interlayer insulating layer 150 and/or the second gate insulating layer 130, so that the auxiliary pads disposed on the interlayer insulating layer 150 may be in contact with the corresponding pads.

More particularly, a first auxiliary pad APD1 is disposed on the interlayer insulating layer 150 so as to overlap the first pad PD1 when viewed from a direction perpendicular to the substrate 100. The first auxiliary pad APD1 is electrically connected to the first pad PD1 via the contact holes formed in the interlayer insulating layer 150 and the second gate insulating layer 130. A second auxiliary pad APD2 is disposed on the interlayer insulating layer 150 so as to overlap the second pad PD2 when viewed from a direction perpendicular to the substrate 100. The second auxiliary pad APD2 is electrically connected to the second pad PD2 via the contact hole formed in the interlayer insulating layer 150. A third auxiliary pad APD3 is disposed on the interlayer insulating layer 150 so as to overlap the third pad PD3 when viewed from a direction perpendicular to the substrate 100. The third auxiliary pad APD3 is electrically connected to the third pad PD3 via the contact hole formed in the interlayer insulating layer 150. A seventh auxiliary pad APD7 is disposed on the interlayer insulating layer 150 so as to overlap the seventh pad PD7 when viewed from a direction perpendicular to the substrate 100. The seventh auxiliary pad APD7 is electrically connected to the seventh pad PD7 via the contact holes formed in the interlayer insulating layer 150 and the second gate insulating layer 130.

The auxiliary pads may be simultaneously formed using the same material as that of the source electrode 215a (see FIG. 5) and the drain electrode 215b (see FIG. 5). As such, the first auxiliary pad APD1, the second auxiliary pad APD2, the third auxiliary pad APD3, and the seventh auxiliary pad APD7 may have substantially the same layer structures as those of the source electrode 215a and the drain electrode 215b. For example, the first auxiliary pad APD1, the second auxiliary pad APD2, the third auxiliary pad APD3, and the seventh auxiliary pad APD7 may each include metal, such as titanium, copper, or aluminum, and may have a single layer structure or a multiple layer structure. When the first auxiliary pad APD1, the second auxiliary pad APD2, the third auxiliary pad APD3, and the seventh auxiliary pad APD7 have a multiple layer structure, the first auxiliary pad APD1, the second auxiliary pad APD2, the third auxiliary pad APD3, and the seventh auxiliary pad APD7 may have a three-layer structure of titanium/aluminum/titanium.

When viewed from a direction perpendicular to the substrate 100, these auxiliary pads may overlap a portion of the connection lines located therebelow. FIG. 3 exemplarily illustrates that, when viewed from a direction perpendicular to the substrate 100, the first auxiliary pad APD1 overlaps the third connection line CL3, and the second auxiliary pad APD2 overlaps the sixth connection line CL6 and/or the seventh connection line CL7. FIG. 4 exemplarily illustrates that, when viewed from a direction perpendicular to the substrate 100, the third auxiliary pad APD3 overlaps the fourth connection line CL4. As such, when viewed from a direction perpendicular to the substrate 100, each of the auxiliary pads may overlap a portion of the connection line that is most adjacent to the corresponding pad located therebelow. In particular, as the distance between the pad and the connection line that is most adjacent to the pad decreases to implement a high-resolution display apparatus, the degree of overlap between the auxiliary pads and the connection lines therebelow may be increased.

Bumps of an electronic device, such as an integrated circuit (IC), may be electrically connected to the auxiliary pads, as illustrated in FIGS. 3 and 4. To this end, an anisotropic conductive film ACF may be disposed between the auxiliary pads and the bumps. The anisotropic conductive film ACF includes an adhesive member AD and conductive balls CB. Because the adhesive member AD has adhesive force, the electronic device such as the IC is bonded to the auxiliary pads or the like on the substrate 100. In this case, the conductive balls CB are disposed between the bumps BP1, BP2, BP3, and BP7 of the electronic device such as the IC and the auxiliary pads, so that the bumps BP1, BP2, BP3, and BP7 are electrically connected to the corresponding auxiliary pads, respectively.

As described above with reference to FIGS. 3 and 4, the adjacent pads among the pads that are sequentially arranged in the first direction (-x direction) are disposed on different layers from each other. In this case, the pads may include corresponding auxiliary pads disposed on the interlayer insulating layer 150 that is the third layer. As such, the bumps of the electronic device such as the IC are located above the auxiliary pads located at a substantially constant height from the substrate 100, and thus, the electronic device such as the IC may be stably disposed on the substrate 100.

The width of each of the connection lines, such as the third connection line CL3, may be about 2 μm to about 3 μm. When the width of each of the connection lines is less than 2 μm, the connection lines may be disconnected during a manufacturing process, and when the width of each of the connection line is greater than 3 μm, a high-resolution image may not be implemented. A space between the adjacent connection lines or a space between the pad and the most adjacent connection line may be about 0.5 μm to about 2 μm. The space between the adjacent connection lines refers to, for example, a distance between the edge of the fifth connection line CL5 in a direction to the fourth connection line CL4 and the edge of the fourth connection line CL4 in a direction to the fifth connection line CL5, when viewed from a direction perpendicular to the substrate 100. The space between the pad and the most adjacent connection line refers to, for example, a distance between the edge of the first pad PD1 in a direction to the third connection line CL3 and the edge of the third connection line CL3 in a direction to the first pad PD1, when viewed from a direction perpendicular to the substrate 100. When the space between the adjacent connection lines or the space between the pad and the most adjacent connection line is less than 0.5 μm, the magnitude of a parasitic capacitance generated between the adjacent connection lines increases rapidly, and when the space is greater than 2 μm, a high-resolution image may not be implemented.

Accordingly, a distance sp between the edge of the first pad PD1 in a direction to the second pad PD2 and the edge of the second pad PD2 in a direction to the first pad PD1 may be about 10.5 μm to about 22 μm. This is because there may be 4 connection lines between the first pad PD1 and the second pad PD2 along the first direction (-x direction) as shown in FIG. 3, thus forming a minimum value of the distance sp of 10.5 μm (=2 μm×4+0.5 μm×5), and a maximum value of the distance sp of 22 μm (=3 μm×4+2 μm×5).

The width wd of the pads in the first direction (-x direction) may be about 6 μm to about 25.5 μm. When the resolution in the display area DA is 500 PPI, the pitch p of the pads in the first direction (-x direction) is about 23 μm. In order to implement such a high-resolution display apparatus, the distance sp between the edge of the first pad PD1 in a direction to the second pad PD2 and the edge of the second pad PD2 in a direction to the first pad PD1 may be about 10.5 μm to about 15 μm. This is because when the display apparatus is a high-resolution display apparatus, the maximum value of the distance sp is limited to 15 μm, which is less than 22 μm. When the distance sp is 10.5 μm, the width of the pads is 12.5 μm (=23 μm−10.5 μm) derived from the difference between the pitch p of the pads and the distance sp. When the distance sp is 15 μm, the width of the pads is 8 μm (=23 μm−15 μm). Accordingly, when the resolution in the display area DA is 500 PPI, the width wd of the pads is about 8 μm to about 12.5 μm. For similar reasons, when the resolution in the display area DA is 400 PPI, the pitch p of the pads in the first direction (-x direction) is about 28 μm and the distance sp is about 10.5 μm to about 22 μm, and thus, the width wd of the pads is about 6 μm to about 17.5 μm. When the resolution in the display area DA is 300 PPI, the pitch p of the pads in the first direction (-x direction) is about 36 µm and the distance sp is about 10.5 µm to about 22 µm, and thus, the width wd of the pads is about 14 µm to about 25.5 µm. Accordingly, the width of the pads is about 6 µm to about 25.5 µm.

Signals applied to the pads are transmitted to the data lines through the connection lines, so that the pixels in the display area DA emit light having luminance corresponding to the signals. A display element is located in the display area DA. For example, as illustrated in FIG. 5, an organic light-emitting device 310 may be located in the display area DA. The organic light-emitting device 310 may be disposed on a planarization layer 170 covering the source electrode 215a and the drain electrode 215b. The planarization layer 170 may planarize substantially the entire upper portion of the thin-film transistor 210. The planarization layer 170 may include, for example, an organic material such as acryl, benzocyclobutene (BCB), or hexamethyldisiloxane (HMDSO). FIG. 5 exemplarily illustrates that the planarization layer 170 has a single layer, but the inventive concepts are not limited thereto. For example, in another embodiment, the planarization layer 170 may have multiple layers. When the display element is the organic light-emitting device 310, the display element may include a pixel electrode 311, an opposite electrode 315, and an intermediate layer 313 located therebetween and including an emission layer.

As illustrated in FIG. 5, the pixel electrode 311 may be in contact with one of the source electrode 215a and the drain electrode 215b via an opening formed in the planarization layer 170 or the like, and may be electrically connected to the thin-film transistor 210. The pixel electrode 311 includes a light-transmitting conductive layer including a light-transmitting conductive oxide, such as ITO, $In_2O_3$ or IZO, and a reflective layer including a metal, such as Al or Ag. For example, the pixel electrode 311 may have a three-layer structure of ITO/Ag/ITO.

A pixel defining layer 175 may be arranged above the planarization layer 170. The pixel defining layer 175 may include an opening corresponding to each sub-pixel, that is, an opening exposing a central portion of at least the pixel electrode 311, thereby defining a pixel. Also, as illustrated in FIG. 5, the pixel defining layer 175 increases a distance between the edge of the pixel electrode 311 and the opposite electrode 315 above the pixel electrode 311, thereby preventing arcs or the like from occurring at the edge of the pixel electrode 311. The pixel defining layer 175 may include, for example, an organic material, such as polyimide or hexamethyldisiloxane (HMDSO).

The intermediate layer 313 of the organic light-emitting device 310 may include a low molecular weight material or a high molecular weight material. When the intermediate layer 313 includes a low molecular weight material, the intermediate layer 313 may have a structure in which a hole injection layer (HIL), a hole transport layer (HTL), an emission layer (EML), an electron transport layer (ETL), and an electron injection layer (EIL) are stacked in a single or multiple structure. The intermediate layer 313 may be formed by vacuum deposition. When the intermediate layer 313 includes a high molecular weight material, the intermediate layer 313 may have a structure including an HTL and an EML. In this case, the HTL may include poly(3,4-ethylenedioxythiophene) (PEDOT), and the EML may include a high molecular weight material such as a poly-phenylenevinylene) (PPV)-based polymer and a polyfluorene-based polymer. The intermediate layer 313 may be formed by screen printing, inkjet printing, or laser induced thermal image (LITI). However, the inventive concepts are not limited thereto, and may have various structures. For example, in some embodiments, the intermediate layer 313 may include an integrated layer throughout the pixel electrodes 311, or may include layers patterned to correspond to the pixel electrodes 311.

The opposite electrode 315 may be arranged above the display area DA and cover the display area DA. In particular, the opposite electrode 315 may be integrally formed with respect to the organic light-emitting devices 310 and may correspond to the pixel electrodes 311. The opposite electrode 315 may include a light-transmitting conductive layer such as ITO, $In_2O_3$, or IZO, and may also include a semi-transmissive layer including metal such as Al or Ag. For example, the opposite electrode 315 may include a semi-transmissive layer including Mg/Ag.

Because the organic light-emitting device 310 may be easily damaged by external moisture or oxygen, an encapsulation layer may cover the organic light-emitting device 310 to protect the organic light-emitting device 310. The encapsulation layer may cover the display area DA and extend to at least a portion of the peripheral area PA. The encapsulation layer may include a first inorganic encapsulation layer, an organic encapsulation layer, and a second inorganic encapsulation layer.

As illustrated in FIG. 2, a first test line TL1 is connected to the first pad PD1, a second test line TL2 is connected to the second pad PD2, and a third test line TL3 is connected to the third pad PD3. As the first pad PD1 is disposed on the first gate insulating layer 120 that is the first layer, the first test line TL1 may also be disposed on the first gate insulating layer 120 that is the first layer, as illustrated in FIG. 4. As the second pad PD2 is disposed on the second gate insulating layer 130 that is the second layer, the second test line TL2 may also be disposed on the second gate insulating layer 130 that is the second layer, as illustrated in FIG. 4. In addition, as the third pad PD3 is disposed on the second gate insulating layer 130 that is the second layer, the third test line TL3 may also be disposed on the second gate insulating layer 130 that is the second layer. In this case, the third test line TL3 is disposed between the first test line TL1 and the second test line TL2, as illustrated in FIG. 2.

A fourth test line TL4 is connected to the fourth pad PD4, a fifth test line TL5 is connected to the fifth pad PD5, and a sixth test line TL6 is connected to the sixth pad PD6. As the fourth pad PD4 and the sixth pad PD6 are disposed on the first gate insulating layer 120 that is the first layer, the fourth test line TL4 and the sixth test line TL6 may also be disposed on the first gate insulating layer 120 that is the first layer. In addition, as the fifth pad PD5 is disposed on the second gate insulating layer 130 that is the second layer, the fifth test line TL5 may also be disposed on the second gate insulating layer 130 that is the second layer.

Each of the test lines extends in a direction away from the display area DA (approximately -y direction) and is electrically connected to a corresponding test transistor. This will be described in more detail later below.

As the resolution of image displayed in the display area DA increases, the number of connection lines for transmitting electrical signals to the display area DA may be increased. As such, the number of test lines corresponding to the connection lines may also be generally increased. However, in the display apparatus according to the illustrated embodiment, the area of the peripheral area PA may be minimized even when the number of test lines increases. More particularly, a distance between the adjacent test lines may be significantly narrowed by arranging the adjacent test lines on different layers from each other. In this manner, even when the number of test lines may be increased, the test lines may be located within a narrow area while being prevented from being short-circuited with each other.

In particular, as illustrated in FIG. 2, the first test line TL1, the third test line TL3, the fourth test line TL4, the fifth test line TL5, and the sixth test line TL6 are sequentially arranged in the first direction (-x direction). The third test line TL3 and the fifth test line TL5 are disposed on the second gate insulating layer 130 that is the second layer, and the first test line TL1, the fourth test line TL4, and the sixth test line TL6 are disposed on the first gate insulating layer 120 that is the first layer. Since the adjacent test lines are disposed on different layers from each other, the adjacent test lines may not be electrically short-circuited even when the distance between the adjacent test lines decreases. In this manner, the total area of the peripheral area PA may be reduced.

This configuration is not limited to the relationship between the test lines. In particular, as illustrated in FIG. 4, the third pad PD3 is located in a layer different from the first test line TL1 that is located adjacent thereto. In addition, the third pad PD3 is disposed on the second gate insulating layer 130 that is the second layer, and is located in a direction (+x direction) opposite to the first direction from the third pad PD3. The first test line TL1 that is most adjacent to the third pad PD3 is disposed on the first gate insulating layer 120 that is the first layer. As such, even when the distance between the third pad PD3 and the first test line TL1 may be decreased, the probability of occurrence of a short-circuit therebetween becomes very low, and thus, the area of the peripheral area PA may be significantly reduced.

As illustrated in FIG. 4, the second gate insulating layer 130 that is the second layer may cover the first test line TL1 disposed on the first gate insulating layer 120 that is the first layer. As such, the third pad PD3 or the like, which is disposed on the second gate insulating layer 130 that is the second layer, and the first test line TL1 or the like, which is located below the second gate insulating layer 130, may be reliably electrically insulated.

Each test line may have substantially the same layer structure as that of the connected pad. This is because each test line may be simultaneously formed using the same material as that of the connected pad. For example, the first test line TL1 may have substantially the same layer structure as that of the first pad PD1, the second test line TL2 may have substantially the same layer structure as that of the second pad PD2, and the third test line TL3 may have substantially the same layer structure as that of the third pad PD3. For example, the first to third test lines TL1 to TL3 may each include metal such as molybdenum or aluminum, and may have a single layer or a multiple layer structure. When the first to third test lines TL1 to TL3 have a multiple layer structure, the gate electrode 213 may have a three-layer structure of molybdenum/aluminum/molybdenum.

Figure 6:
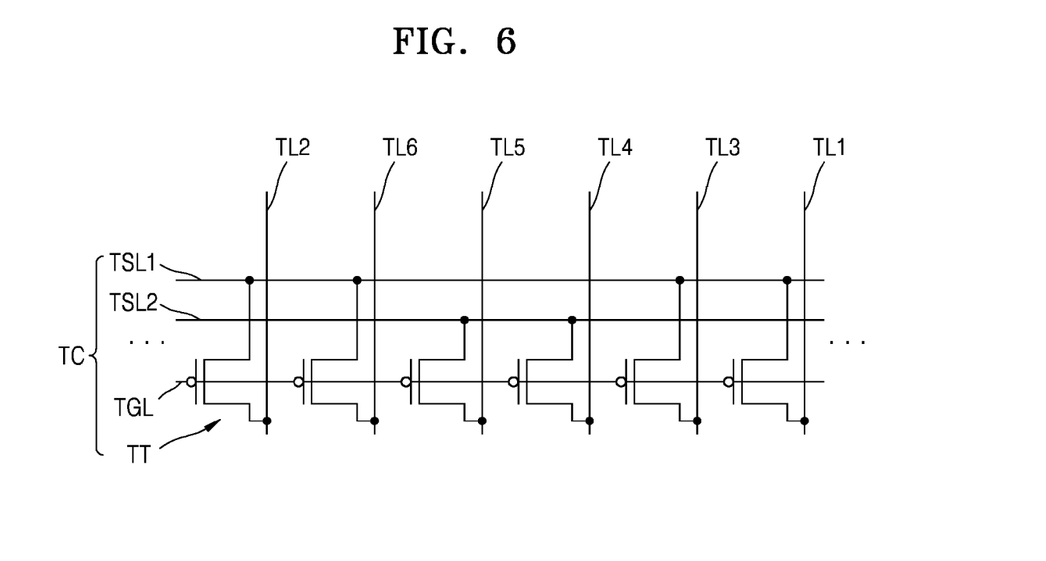
FIG. 6 is a schematic circuit diagram of a test circuit located in a test circuit part of FIG. 1 according to an embodiment of the invention.

As illustrated in FIG. 2, the first to third test lines TL1 to TL3 may extend in a direction (approximately -y direction) opposite to the direction of the display area DA, and may be electrically connected to the test circuit part TC. FIG. 6 is a schematic circuit diagram of a test circuit located in the test circuit part TC of FIG. 1 according to an embodiment.

As illustrated in FIG. 6, gate electrodes of test thin-film transistors TT are electrically connected to each other by a test gate line TGL. As such, when an electrical signal is applied to the test gate line TGL, the test thin-film transistors TT are simultaneously turned on. An electrical signal from a first test signal line TSL1 is transmitted to the corresponding data lines through the test lines TL2, TL6, TL3, and TL1, and the pads and the connection lines connected thereto. Accordingly, the pixels in the display area DA, which are electrically connected to the data lines, may emit light. In the manner, whether the pixels in the display area DA are defective may be tested. Similarly, an electrical signal from a second test signal line TSL2 is transmitted to the corresponding data lines through the test lines TL5 and TL4, and the pads and the connection lines connected thereto. Accordingly, the pixels in the display area DA, which are electrically connected to the data lines, may emit light. In this manner, whether the pixels in the display area DA are defective may be tested. In some embodiments, the first test signal line TSL1 and the second test signal line TSL2 may be integrally formed with each other.

Figure 7:
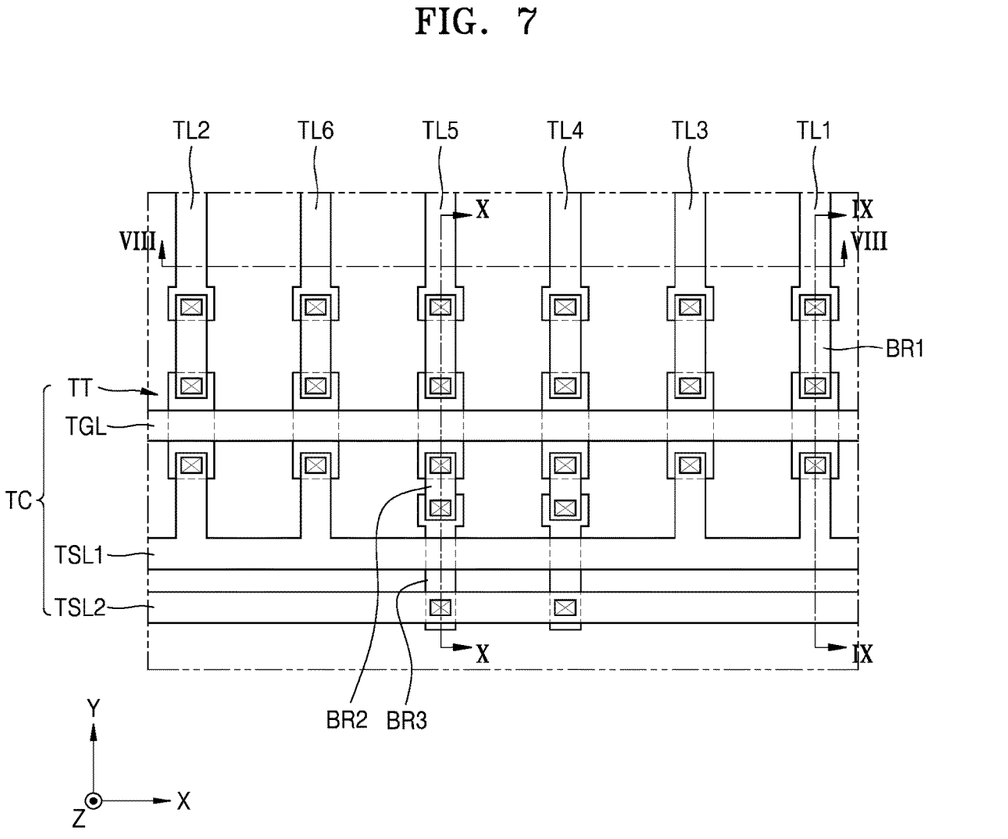
FIG. 7 is a schematic plan view of a portion of the test circuit part of FIG. 1 according to an embodiment of the invention.
Figure 8:
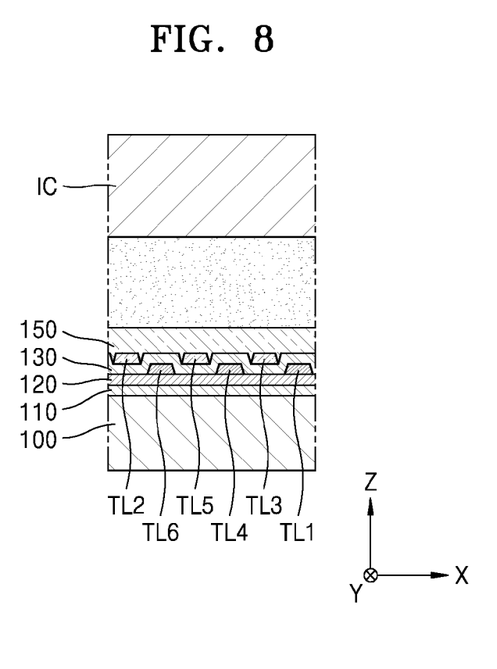
FIG. 8 is a schematic cross-sectional view taken along line VIII-VIII of the display apparatus of FIG. 7 according to an embodiment of the invention.
Figure 9:
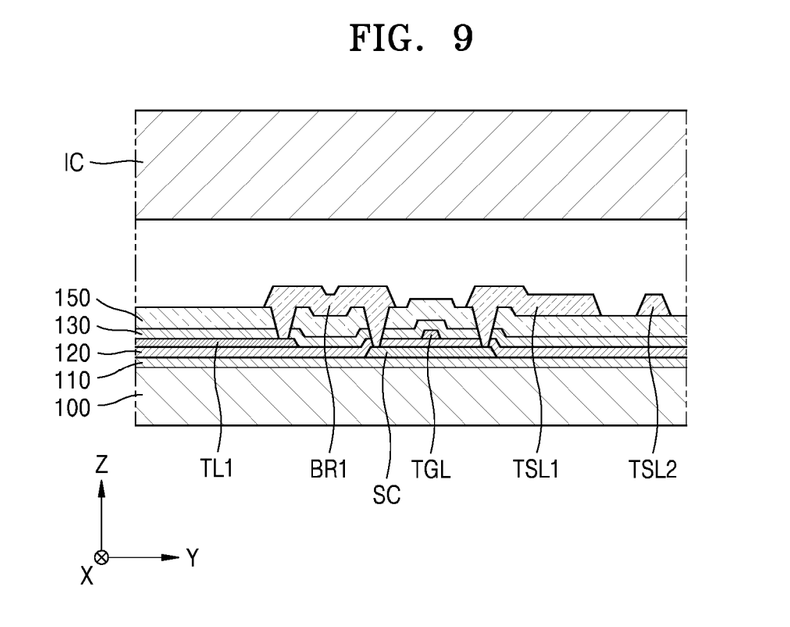
FIG. 9 is a schematic cross-sectional view taken along line IX-IX of the display apparatus of FIG. 7 according to an embodiment of the invention.
Figure 10:
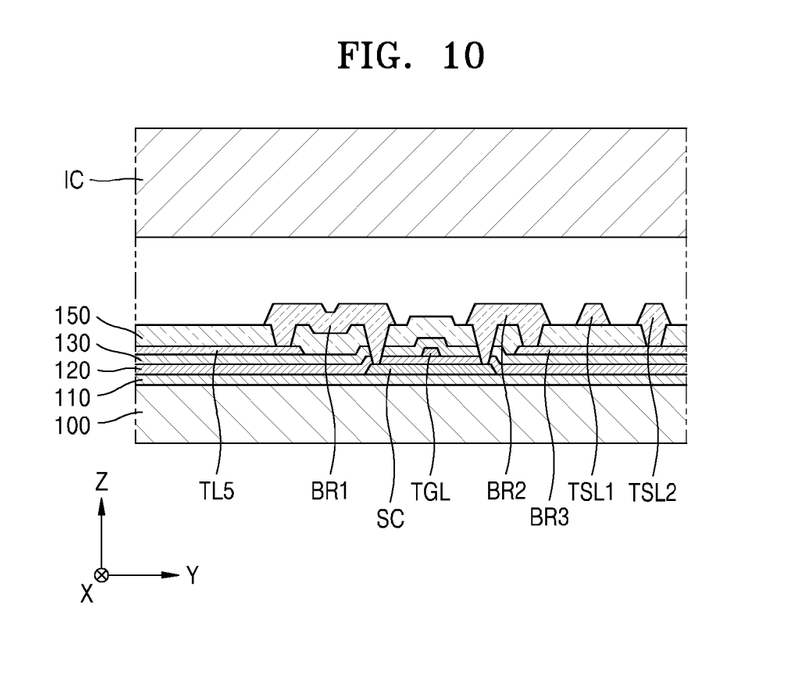
FIG. 10 is a schematic cross-sectional view taken along line X-X of the display apparatus of FIG. 7 according to an embodiment of the invention.

FIG. 7 is a schematic plan view of a portion of the test circuit part TC of FIG. 1 according to an embodiment. FIG. 8 is a schematic cross-sectional view taken along line VIII-VIII of the display apparatus of FIG. 7 according to an embodiment, FIG. 9 is a schematic cross-sectional view taken along line IX-IX of the display apparatus of FIG. 7 according to an embodiment, and FIG. 10 is a schematic cross-sectional view taken along line X-X of the display apparatus of FIG. 7 according to an embodiment.

As illustrated in FIG. 8, the first to sixth test lines TL1 to TL6 are arranged on the first gate insulating layer 120 or the second gate insulating layer 130. As illustrated in FIG. 7, the first to sixth test lines TL1 to TL6 are electrically connected to one end of the semiconductor layer SC of the test thin-film transistor TT through first bridge lines BR1.

The first bridge line BR1 may function as a drain electrode of the test thin-film transistor TT. The first bridge line BR1 may be disposed on the interlayer insulating layer 150 that is the third layer covering the second test line TL2, the third test line TL3, and the fifth test line TL5. The first bridge line BR1 may be simultaneously formed using the same material as that of the source electrode 215*a* and the drain electrode 215*b* described above with reference to FIG. 5. In particular, the first bridge line BR1 may have substantially the same layer structure as that of the auxiliary pad described above with reference to FIGS. 3 and 4.

The other end of each of the semiconductor layers SC of some test thin-film transistors TT may be directly connected to the first test signal line TSL1. For example, as illustrated in FIG. 9, the other end of the semiconductor layer SC having one end electrically connected to the first test line TL1 may be connected to the first test signal line TSL1 via a contact hole. The first test signal line TSL1 may be disposed on the interlayer insulating layer 150 that is the third layer, and may be simultaneously formed using the same material as that of the source electrode 215*a* and the drain electrode 215*b* described above with reference to FIG. 5. As such, the first test signal line TSL1 may have substantially the same layer structure as that of the auxiliary pad described above with reference to FIGS. 3 and 4.

The other end of each of the semiconductor layers SC of some test thin-film transistors TT may be electrically connected to the second test signal line TSL2 through a second bridge line BR2 and a third bridge line BR3. For example, as illustrated in FIG. 10, the other end of the semiconductor layer SC having one end electrically connected to the fifth test line TL5 may be electrically connected to the second bridge line BR2 disposed on the interlayer insulating layer 150 that is the third layer via a contact hole. The second bridge line BR2 may be connected to the third bridge line BR3 located below the interlayer insulating layer 150 via a contact hole. The third bridge line BR3 may pass under the first test signal line TSL1 and extend under the second test signal line TSL2. The second test signal line TSL2 may be connected to the third bridge line BR3 via a contact hole formed in the interlayer insulating layer 150 or the like.

The second bridge line BR2 and the second test signal line TSL2 may be disposed on the interlayer insulating layer 150 that is the third layer, and may be simultaneously formed using the same material as that of the source electrode 215a and the drain electrode 215b described above with reference to FIG. 5. As such, the second bridge line BR2 and the second test signal line TSL2 may have substantially the same layer structure as that of the auxiliary pad described above with reference to FIGS. 3 and 4. As illustrated in FIG. 10, the third bridge line BR3 may be disposed on the second gate insulating layer 130. In this case, the third bridge line BR3 may include the same material as that of the fifth test line TL5 and may have substantially the same layer structure as that of the fifth test line TL5. However, the inventive concepts are not limited thereto. For example, in some embodiments, the third bridge line BR3 may be disposed between the first gate insulating layer 120 and the second gate insulating layer 130, and may be connected to the second test signal line TSL2 via contact holes formed in the second gate insulating layer 130 and the interlayer insulating layer 150. In this case, the third bridge line BR3 may include the same material as that of the first pad PD1 (see FIG. 3) and may have substantially the same layer structure as that of the first pad PD1.

The test gate line TGL extends in the first direction (-x direction) to pass over the semiconductor layers SC of the test thin-film transistors TT. In the test gate line TGL, portions overlapping the semiconductor layers SC of the test thin-film transistors TT may function as the gate electrodes of the test thin-film transistors TT. As the test gate line TGL is disposed on the first gate insulating layer 120, the test gate line TGL may also include the same material as that of the first pad PD1 disposed on the first gate insulating layer 120 and may have substantially the same layer structure as that of the first pad PD1.

As described above with reference to FIG. 2, the first test line TL1, the second test line TL2, the third test line TL3, the fourth test line TL4, the fifth test line TL5, and the sixth test line TL6 are sequentially located in the first direction (-x direction). As illustrated in FIG. 8, the second test line TL2, the third test line TL3, and the fifth test line TL5 are disposed on the second gate insulating layer 130 that is the second layer, and the first test line TL1, the fourth test line TL4, and the sixth test line TL6 are disposed on the first gate insulating layer 120 that is the first layer. As such, since the adjacent test lines are disposed on different layers from each other, the adjacent test lines may not be electrically short-circuited even when the distance between the adjacent test lines decreases. In this manner, the total area of the peripheral area PA may be reduced while the display apparatus is capable of displaying the high-resolution image.

In general, the test for defects of the display elements in the display area DA using the test thin-film transistor TT is performed during the manufacturing process. When the manufacture of a display apparatus is completed, the test thin-film transistors TT are turned off. For example, when the test thin-film transistors TT are p-type thin-film transistors, the test thin-film transistors TT are turned off by applying a VGH bias voltage (positive bias voltage) to the test gate line TGL. In this manner, signals from the electronic device such as the IC may be applied to the data lines through the pads and the connection lines.

According to embodiments, the display apparatus is capable of displaying the high-resolution image while having a reduced peripheral area.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a substrate comprising a display area and a peripheral area outside the display area;
   a first pad disposed on a first insulating layer in the peripheral area;
   a second pad disposed adjacently to the first pad in a first direction in the peripheral area, the second pad being disposed on a second insulating layer different from the first insulating layer;
   a third pad disposed adjacently to the first pad in a second direction crossing the first direction in the peripheral area, the third pad being disposed on the second insulating layer;
   a first auxiliary pad overlapping the first pad in a plan view;
   a second auxiliary pad overlapping the second pad in the plan view;
   a third auxiliary pad overlapping the third pad in the plan view;
   a first connection line disposed on the first insulating layer and connected to the first pad;
   a second connection line disposed on the second insulating layer and connected to the second pad;
   a third connection line disposed on the second insulating layer, connected to the third pad, and disposed between the first connection line and the second connection line; and
   a third layer covering the second pad and the third pad,
   wherein the first auxiliary pad is disposed on the third layer and electrically connected to the first pad;
   wherein the second auxiliary pad is disposed on the third layer and electrically connected to the second pad; and
   wherein the third auxiliary pad is disposed on the third layer and electrically connected to the third pad.

2. The display apparatus of claim 1, wherein the second insulating layer covers the first pad.

3. The display apparatus of claim 1, wherein the first connection line and the first pad comprise the same layer structure, the second connection line and the second pad comprise the same layer structure, and the third connection line and the third pad comprise the same layer structure.

4. The display apparatus of claim 1, wherein the first, second, and third connection lines extend in a direction towards the display area.

5. The display apparatus of claim 4, wherein the first connection line is electrically connected to a first data line over the display area, the second connection line is electrically connected to a second data line over the display area, and the third connection line is electrically connected to a third data line over the display area.

6. The display apparatus of claim 5, wherein the third data line is disposed between the first data line and the second data line.

7. The display apparatus of claim 1, further comprising:
   a first test line disposed on the first insulating layer and connected to the first pad;

a second test line disposed on the second insulating layer and connected to the second pad; and a third test line disposed on the second insulating layer, connected to the third pad, and disposed between the first test line and the second test line.

8. The display apparatus of claim 7, wherein the second insulating layer covers the first test line.

9. The display apparatus of claim 7, wherein the first test line and the first pad comprise the same layer structure, the second test line and the second pad comprise the same layer structure, and the third test line and the third pad comprise the same layer structure.

10. The display apparatus of claim 7, wherein the first, second, and third test lines extend in a direction away from the display area.

11. The display apparatus of claim 10, wherein each of the first, second, and third test lines is electrically connected to a corresponding test transistor, respectively.

12. The display apparatus of claim 10, further comprising bridge lines electrically connecting the first, second, and third test lines to corresponding test transistors, respectively.

13. The display apparatus of claim 12, wherein the bridge lines are disposed on a third layer covering the second test line and the third test line.

14. The display apparatus of claim 1, wherein a distance between an edge of the first pad in a direction to the second pad and an edge of the second pad in a direction to the first pad is about 10.5 μm to about 22 μm.

15. The display apparatus of claim 1, wherein a width of the first pad in a direction to the second pad is about 6 μm to about 25.5 μm.

16. The display apparatus of claim 1, wherein a width of each of the first to third connection lines is about 2 μm to about 3 μm.

17. The display apparatus of claim 1, wherein the first auxiliary pad overlaps the third connection line in the plan view.

18. A display apparatus comprising: a substrate comprising a display area and a pad area; a first pad disposed on a first layer in the pad area; a second pad in the pad area, the second pad being separated from the first pad in a first direction, the second pad being disposed on a second layer different from the first layer; a third pad, a fourth pad, and a fifth pad in the pad area, the third pad, the fourth pad, and the fifth pad being arranged along a second direction different from the first direction; a first connection line between the first pad and the second pad, the first connection line being connected to the third pad; a second connection line between the first connection line and the second pad, the second connection line being connected to the fourth pad; and a third connection line between the second connection line and the second pad, the third connection line being connected to the fifth pad; wherein the first connection line and the third connection line are disposed on the second layer, and wherein the second connection line is disposed on the first layer.

19. The display apparatus of claim 18, wherein the second layer covers the first connection line and the third connection line.

* * * * *